(12) United States Patent
Bai

(10) Patent No.: US 10,637,407 B2
(45) Date of Patent: Apr. 28, 2020

(54) MULTIMODE POWER AMPLIFIER MODULE, CHIP AND COMMUNICATION TERMINAL

(71) Applicant: Vanchip (Tianjin) Technology Co., Ltd., Tianjin (CN)

(72) Inventor: Yunfang Bai, Tianjin (CN)

(73) Assignee: Vanchip (Tianjin) Technology Co., Ltd., Tianjin (CN)

( * ) Notice: Subject to any disclaimer, the term of this patent is extended or adjusted under 35 U.S.C. 154(b) by 19 days.

(21) Appl. No.: 15/780,241

(22) PCT Filed: Dec. 1, 2016

(86) PCT No.: PCT/CN2016/108305
§ 371 (c)(1),
(2) Date: May 31, 2018

(87) PCT Pub. No.: WO2017/092705
PCT Pub. Date: Jun. 8, 2017

(65) Prior Publication Data
US 2018/0375479 A1 Dec. 27, 2018

(30) Foreign Application Priority Data

Dec. 1, 2015 (CN) .......................... 2015 1 0870113
Jun. 30, 2016 (CN) .......................... 2016 1 0517854

(51) Int. Cl.
*H03F 1/32* (2006.01)
*H03F 1/42* (2006.01)
(Continued)

(52) U.S. Cl.
CPC ................. *H03F 1/32* (2013.01); *H03F 1/42* (2013.01); *H03F 1/56* (2013.01); *H03F 3/195* (2013.01);
(Continued)

(58) Field of Classification Search
CPC ..................................... H03F 1/32; H03F 1/56
See application file for complete search history.

(56) References Cited

U.S. PATENT DOCUMENTS

2006/0211390 A1* 9/2006 Uozumi ................. H04B 1/006
455/180.3

FOREIGN PATENT DOCUMENTS

CN 102510297 * 6/2012 ............... H03F 3/20

* cited by examiner

*Primary Examiner* — Tuan H Nguyen

(57) ABSTRACT

A multimode power amplifier module, a chip and a communication terminal. In the module, a control circuit (104) sends a bias signal to a low-frequency power amplifier (102) or a high-frequency power amplifier (106) according to a baseband signal, so as to control the amplification of an accessed low-frequency radio frequency signal or a high-frequency radio frequency signal by the low-frequency power amplifier (102) or the high-frequency power amplifier (106); and a transceiving switch (108) selects a corresponding operation mode to conduct transmission or receiving according to an operation mode selection signal. A power amplification path is reused according to different modes, so that the power amplification path can be shared by different operation modes of a high and low frequency band with the adjustment of the control circuit (104), thus simplifying the complexity in designing the power amplifier module, and reducing the cost of relevant design implementation.

18 Claims, 8 Drawing Sheets

(51) Int. Cl.
*H03F 1/56* (2006.01)
*H03F 3/195* (2006.01)
*H03F 3/213* (2006.01)
*H04B 1/04* (2006.01)

(52) U.S. Cl.
CPC ............... *H03F 3/213* (2013.01); *H04B 1/04* (2013.01); *H04B 2001/0408* (2013.01)

MULTIMODE POWER AMPLIFIER MODULE, CHIP AND COMMUNICATION TERMINAL

RELATED APPLICATIONS

This application is a National Phase of PCT Patent Application No. PCT/CN2016/108305 having International filing date of Dec. 1, 2016, which claims the benefit of priority of Chinese Patent Applications Nos. 201510870113.1 filed on Dec. 1, 2015, and 201610517854.6 filed on Jun. 30, 2016. The contents of the above applications are all incorporated by reference as if fully set forth herein in their entirety.

FIELD AND BACKGROUND OF THE INVENTION

The present invention relates to a multimode power amplifier module, a method for controlling the multimode power amplifier module, and a chip and a communication terminal that include the multimode power amplifier module, and belongs to the field of wireless communication technologies.

Currently, 4GLTE has entered a phase of large-scale promotion. However, it is quite a long process to implement full coverage of VoLTE, that is, mobile wideband audio application, and make traditional circuit switching quit the historical stage. Reasons are that on one hand, VoLTE relates to relatively many new technologies and requires necessary tests and experiments, and on the other hand, deployment and integration of an IMS (IP multimedia subsystem) takes some time, and a device of an existing network also needs to be upgraded and improved step by step.

Within quite a long period of time, an LTE network cannot provide an audio service. An audio part needs to use a 3G/2G network. Because 3GWCDMA/CDMA relates to a problem of patent fees of Qualcomm, a platform manufacturer, for example, Media Tek, Spreadtrum, and Leadcore Technology all launch a solution of applying 2G to an audio part. Therefore, 2GGSM is indispensable within quite a long time in 4G communication. For this, mobile operators are making great efforts to promote three-mode and five-mode solutions. Three modes are mainly GSM/TD_SCDMA/TDD_LTE. Five modes are mainly GSM/TD_SCDMA/TDD_LTE/WCDMA/FDD_LTE. It is not hard to see that three modes and five modes are both inseparable from several modes: GSM/EDGE/TD_SCDMA/TDD_LTE.

In the foregoing several modes, two time-division multiplexing modes, TD-SCDMA and TDD-LTE, are mainly used for data transmission. Therefore, power consumption is a relatively serious problem. Power consumption of a multimode power amplifier module mainly focuses on a power amplifier. If performance and power consumption optimization of a power amplification chip can be performed in the two time-division multiplexing modes, performance and power consumption of the multimode power amplifier module can be optimized.

SUMMARY OF THE INVENTION

A primary technical solution to be resolved by the present invention is to provide a multimode power amplifier module.

Another technical solution to be resolved by the present invention is to provide a method for controlling a multimode power amplifier module.

Still another technical solution to be resolved by the present invention is to provide a chip and a communication terminal that include a multimode power amplifier module.

To achieve the foregoing invention objectives, the present invention uses the following technical solutions:

According to a first aspect of embodiments of the present invention, a multimode power amplifier module is provided. The multimode power amplifier module includes: a low-frequency power amplifier channel, a high-frequency power amplifier channel, a control circuit, and a transmit-receive switch, where the low-frequency power amplifier channel includes a low-frequency input matching network, a low-frequency power amplifier, and a low-frequency output matching network that are connected in series and in sequence; the low-frequency input matching network is used to access a low-frequency radio frequency signal, to implement impedance matching; the low-frequency power amplifier is used to amplify the low-frequency radio frequency signal; the low-frequency output matching network is used to implement low-frequency impedance conversion, to output a low-frequency output power according to the amplified low-frequency radio frequency signal;

the high-frequency power amplifier channel includes a high-frequency input matching network, a high-frequency power amplifier, and a high-frequency output matching network that are connected in series and in sequence; the high-frequency input matching network is used to access a high-frequency radio frequency signal, to implement impedance matching; the high-frequency power amplifier is used to amplify the high-frequency radio frequency signal; the high-frequency output matching network is used to implement high-frequency impedance conversion, to output a high-frequency output power according to the amplified high-frequency radio frequency signal;

the control circuit accesses a control power supply Vbat, a baseband signal Vramp, and a working mode selection signal; the control circuit sends an amplifier control signal to the low-frequency power amplifier or the high-frequency power amplifier, to control the low-frequency power amplifier or the high-frequency power amplifier to amplify the accessed low-frequency radio frequency signal or high-frequency radio frequency signal; and the transmit-receive switch is connected to the control circuit, the low-frequency output matching network, and the high-frequency output matching network; and the transmit-receive switch is used to select, according to the working mode selection signal, a corresponding working mode for transmission or receiving.

Preferably, the multimode power amplifier module supports a GSM, EDGE, TD_SCDMA, and/or a TDD_LTE working mode; and the low-frequency input matching network is used to access a low-frequency GSM signal or a low-frequency EDGE signal; and the high-frequency input matching network is used to access a high-frequency GSM signal, a high-frequency EDGE signal, a TD_SCDMA signal, or a TDD_LTE signal.

Preferably, the amplifier control signal sent by the control circuit to the low-frequency power amplifier or the high-frequency power amplifier includes: a logic signal Vmode, an offset signal Reg, and/or a collector voltage Vcc.

Preferably, a feedback circuit is disposed in the low-frequency power amplifier or the high-frequency power amplifier; the logic signal Vmode is used to control a feedback switch on the feedback circuit to be opened or closed;

when the logic signal Vmode controls the feedback switch to be opened, the low-frequency power amplifier or the high-frequency power amplifier works in a high gain mode; and when the logic signal Vmode controls the feedback switch to be closed, the low-frequency power amplifier or the high-frequency power amplifier works in a low gain mode.

Preferably, the collector voltage Vcc is used to supply power to the low-frequency power amplifier or the high-frequency power amplifier, to control an output power of the low-frequency radio frequency signal or the high-frequency radio frequency signal amplified by the low-frequency power amplifier or the high-frequency power amplifier; and the control circuit selects a corresponding basis voltage according to the working mode selection signal and generates the collector voltage Vcc according to the basis voltage.

Preferably, when the working mode selection signal is in a GSM mode, the control circuit selects the baseband signal Vramp as the basis voltage, to generate the collector voltage Vcc; and when the working mode selection signal is in an EDGE, TD_SCDMA, or TDD_LTE mode, the control circuit selects a reference voltage Vref as the basis voltage, to generate the collector voltage Vcc, where the reference voltage Vref and the control power supply Vbat linearly change.

Preferably, the offset signal Reg is used to adjust a current of the low-frequency power amplifier or the high-frequency power amplifier; and the control circuit closes a corresponding switch in an offset signal switch group according to the working mode selection signal, to generate an offset signal Reg corresponding to a working mode; and switches corresponding to the working modes are disposed in the offset signal switch group.

Preferably, the control circuit includes an offset signal generation circuit; the offset signal generation circuit includes: an operational amplifier, a p-channel metal-oxide-semiconductor field-effect transistor (PMOS), and the offset signal switch group;

a positive input end of the operational amplifier accesses the reference voltage Vref; an output end of the operational amplifier is connected to a gate of the p-channel metal-oxide-semiconductor field-effect transistor (PMOS); a source of the PMOS accesses the control power supply Vbat; and a drain of the PMOS is an output end of the offset signal generation circuit and is used to output the offset signal Reg;

the offset signal switch group is connected between a negative input end of the operational amplifier and a resistor; and resistors are connected in series between the switches in the offset signal switch group.

Preferably, the offset signals Reg corresponding to the GSM, EDGE, TDD_LTE, and TD_SCDMA working modes are sequentially reduced.

Preferably, the offset signal Reg accesses an offset circuit of a power amplifier; the offset circuit includes R71, D71, D72, and a collector of a Q71 biopolar transistor; the diodes D71 and D72 and the resistor R71 are used to generate a voltage V71 through voltage division; the voltage V71 generates a voltage V72 through voltage drop; current control over a biopolar transistor Q71 is implemented according to V72 and V73; and the biopolar transistor Q72 is a power amplifier tube of the power amplifier.

According to a second aspect of the embodiments of the present invention, a time-division-multiplexing-oriented multimode power amplifier module is provided. The time-division-multiplexing-oriented multimode power amplifier module includes: a low-frequency power amplifier channel, a high-frequency power amplifier channel, a control circuit, and a transmit-receive switch, where the low-frequency power amplifier channel includes a low-frequency input matching network, a low-frequency power amplifier, and a low-frequency output matching network that are connected in series and in sequence; the low-frequency input matching network is used to access a low-frequency radio frequency signal, to implement impedance matching; the low-frequency power amplifier is used to amplify the low-frequency radio frequency signal; the low-frequency output matching network is used to implement low-frequency impedance conversion, to output a low-frequency output power according to the amplified low-frequency radio frequency signal;

the high-frequency power amplifier channel includes a high-frequency input matching network, a high-frequency power amplifier, and a high-frequency output matching network that are connected in series and in sequence; the high-frequency input matching network is used to access a high-frequency radio frequency signal, to implement impedance matching; the high-frequency power amplifier is used to amplify the high-frequency radio frequency signal; the high-frequency output matching network is used to implement high-frequency impedance conversion, to output a high-frequency output power according to the amplified high-frequency radio frequency signal; and the control circuit generates different offset signals in a time-division multiplexing working mode according to magnitudes of baseband signals, to offset the low-frequency power amplifier or the high-frequency power amplifier to amplify the accessed low-frequency radio frequency signal or high-frequency radio frequency signal; and the transmit-receive switch selects, according to a working mode selection signal, a corresponding working mode for transmission or receiving.

Preferably, the time-division multiplexing working mode is a TD_SCDMA and/or TDD_LTE working mode.

Preferably, in the control circuit, the baseband signal is input to a negative input end of an operational amplifier, and an output end of the operational amplifier is connected to a gate of the transistor; and a source of the transistor accesses a control power supply, and a drain outputs the offset signal.

Preferably, in the control circuit, the baseband signal and the reference voltage respectively access a positive input end and a negative input end of a multi-channel analog switch, and an output end of the multi-channel analog switch accesses a negative input end of the operational amplifier.

Preferably, the multi-channel analog switch has at least two channels, and opening or closing of the channels are determined by the baseband signal and the working mode.

Preferably, in the control circuit, the drain of the transistor is connected to the ground by using a first resistor and a second resistor that are connected in series, and a connection point of the first resistor and the second resistor is connected to a positive input end of the operational amplifier.

Preferably, in the control circuit, a gating switch is disposed between a connection point of adjacent resistors and the positive input end of the operational amplifier, and the gating switch changes an on-off state according to the baseband signal or the working mode.

Preferably, in the control circuit, the drain of the transistor is connected to the ground by using a plurality of resistors that are mutually connected in series, and a connection point of adjacent resistors is connected to a positive input end of the operational amplifier.

Preferably, the low-frequency power amplifier channel has at least a one-stage amplification circuit, and the high-frequency power amplifier channel has at least a one-stage amplification circuit.

According to a third aspect of the embodiments of the present invention, a method for controlling a multimode power amplifier module, including the following steps:

providing an offset signal to a low-frequency power amplifier channel, where a magnitude of the offset signal is determined by a magnitude of a baseband signal and a working mode; and providing an offset signal to a high-frequency power amplifier channel, where a magnitude of the offset signal is determined by the magnitude of the baseband signal and the working mode.

Preferably, the offset signal is controlled by the baseband signal and the working mode and linearly or nearly linearly changes with the baseband signal.

Alternatively, the offset signal is controlled by the baseband signal and the working mode and changes with the baseband signal in a stair step manner.

Alternatively, the offset signal is controlled by the baseband signal and the working mode and linearly changes with the baseband signal in a step manner.

According to a fourth aspect of the embodiments of the present invention, a chip having a multimode power amplifier module is provided. The chip includes any multimode power amplifier module described above.

According to a fifth aspect of the embodiments of the present invention, a communication terminal having a multimode power amplifier module is provided. The communication terminal includes any multimode power amplifier module described above.

Compared with the prior art, in the multimode power amplifier module, the chip, and the communication terminal provided in the present invention, according to frequency band features in different modes in a communication protocol, a power amplifier channel is fully multiplexed, so that different working modes of high and low frequency bands can share the power amplifier channel through adjustment of the control circuit, and in a time-division multiplexing mode, an offset voltage or offset current is made to implement a plurality of values as the baseband signal varies, so as to simplify design complexity of the power amplifier module and reduce costs of implementation of a related design.

DESCRIPTION OF SPECIFIC EMBODIMENTS OF THE INVENTION

The technical content of the present invention is further described in detail below with reference to the accompanying drawings and specific embodiments.

It should be noted first that in the embodiments of the present invention, the involved communication terminal refers to a computer device that may be used in a mobile environment and supports a plurality of communication systems such as GSM, EDGE, TD_SCDMA, TDD_LTE, and FDD_LTE. The communication terminal includes but is not limited to a mobile phone, a notebook computer, a tablet computer, and an on-board computer. In addition, the multimode power amplifier module is also applicable to scenarios to which other multi-mode technologies are applied, for example, a communication base station compatible with multiple communication systems.

As stated in Related Art of the present invention, whether a three-mode solution or a five-mode solution includes three modes GSM/TD_SCDMA/TDD_LTE. Due to limitation of LTE network coverage, in a current three-mode/five-mode solution, it is still required to be compatible with an EDGE mode. A frequency of a PCS band in high-frequency GSM is 1850 MHz to 1910 MHz, a frequency band of TD_SCDMA is 1880 MHz to 1920 MHz and 2010 MHz to 2025 MHz, and a B39 frequency band of TD_LTE is 1880 MHz to 1920 MHz. Frequencies in the three modes are relatively close. In addition, frequency bands of GSM and EDGE completely overlap. These provide a possibility for circuit multiplexing. A power amplifier module has different requirements on an output power, a gain, linearity, and a working current when working in different modes. The foregoing indexes of the power amplifier module are determined by a power amplifier in the module. Therefore, the output power, gain, current, and linearity can be optimized by optimizing a gain network, a collector voltage, and an offset voltage (current) of the power amplifier in different modes.

Figure 1:
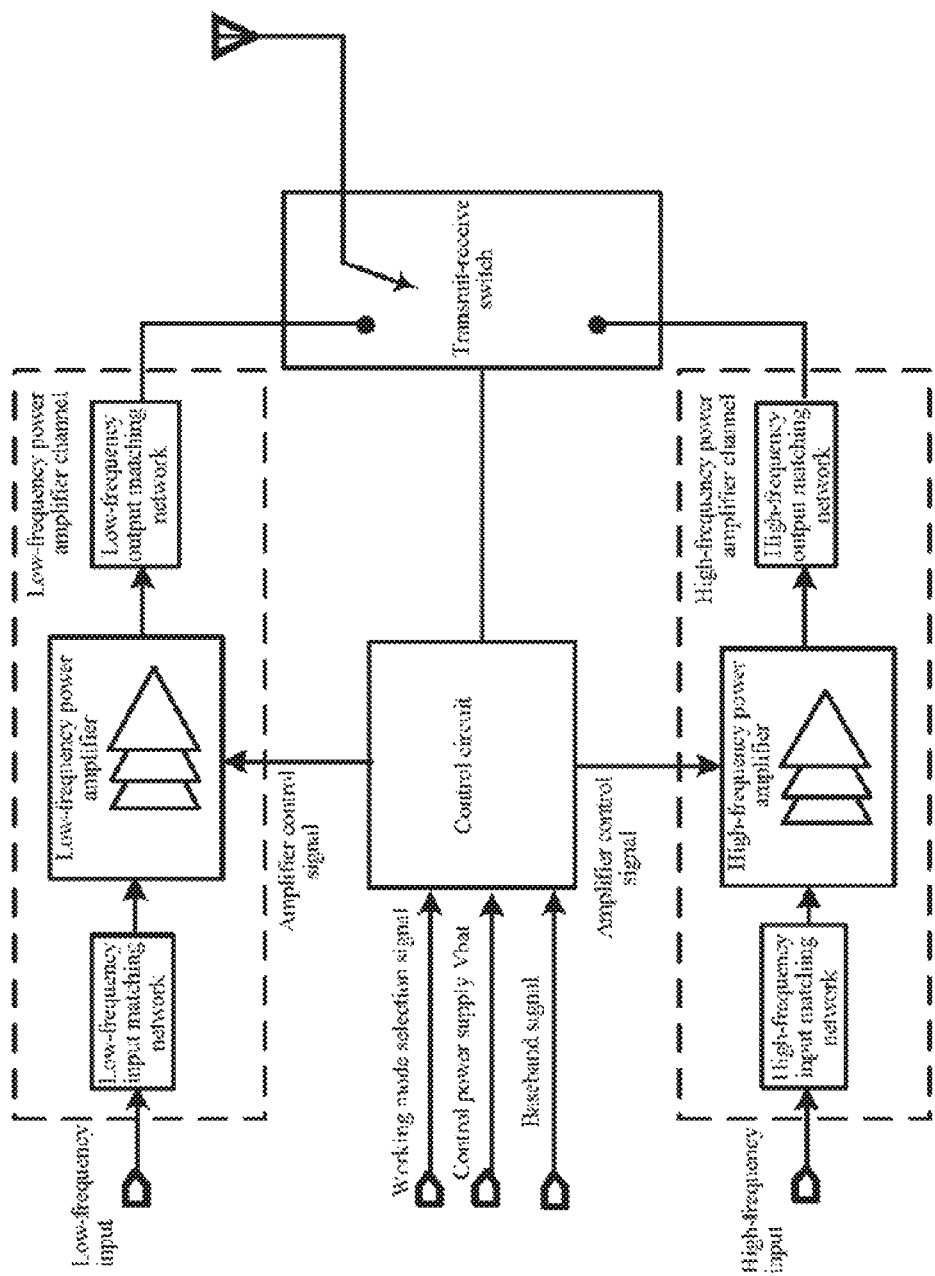
FIG. 1 is a structural block diagram of a multimode power amplifier module according to an embodiment.

FIG. 1 is a structural block diagram of a multimode power amplifier module according to an embodiment. As shown in FIG. 1, the multimode powder amplifier module includes: a low-frequency power amplifier channel, a high-frequency power amplifier channel, a control circuit, and a transmit-receive switch. The low-frequency power amplifier channel has at least a one-stage amplification circuit, and the high-frequency power amplifier channel also has at least a one-stage amplification circuit.

The low-frequency power amplifier channel includes a low-frequency input matching network, a low-frequency power amplifier, and a low-frequency output matching network that are connected in series and in sequence. The low-frequency input matching network is provided with a low-frequency input end and is used to access a low-frequency radio frequency signal, to implement impedance matching. The low-frequency power amplifier accesses the low-frequency radio frequency signal output by the low-frequency input matching network and is used to amplify the low-frequency radio frequency signal. The low-frequency output matching network is used to implement low-frequency impedance conversion, to output a low-frequency output power according to the amplified low-frequency radio frequency signal.

The high-frequency power amplifier channel includes a high-frequency input matching network, a high-frequency power amplifier, and a high-frequency output matching network that are connected in series and in sequence. The high-frequency input matching network is provided with a high-frequency input end and is used to access a high-frequency radio frequency signal, to implement impedance matching. The high-frequency power amplifier accesses the high-frequency radio frequency signal output by the high-frequency input matching network and is used to amplify the high-frequency radio frequency signal. The high-frequency output matching network is used to implement high-frequency impedance conversion, to output a high-frequency output power according to the amplified high-frequency radio frequency signal.

The control circuit is a core control component of the multimode power amplifier module. The control circuit is provided with at least three input ends, which are respectively used to access a control power supply Vbat, a baseband signal Vramp, and a working mode selection signal. The control circuit is connected to the low-frequency power amplifier and the high-frequency power amplifier and sends an amplifier control signal to the low-frequency power amplifier or the high-frequency power amplifier according to the baseband signal Vramp and the working mode selection signal. By using the control signal, the low-frequency power amplifier or the high-frequency power amplifier is controlled to amplify and optimize the accessed low-frequency radio frequency signal or high-frequency radio frequency signal.

The transmit-receive switch is connected to the control circuit, the low-frequency output matching network, and the high-frequency output matching network. The transmit-receive switch is used to select, according to the working mode selection signal, a corresponding working mode for transmission or receiving.

In the multimode power amplifier module, according to frequency band features in different modes in a communication protocol, a power amplifier channel is fully multiplexed, so that different working modes of high and low frequency bands can share the power amplifier channel through adjustment of the control circuit, so as to simplify design complexity of the power amplifier module, reduce costs of implementation of a related design, and provide advantages of being simple and flexible and being easy to implement.

Figure 2:
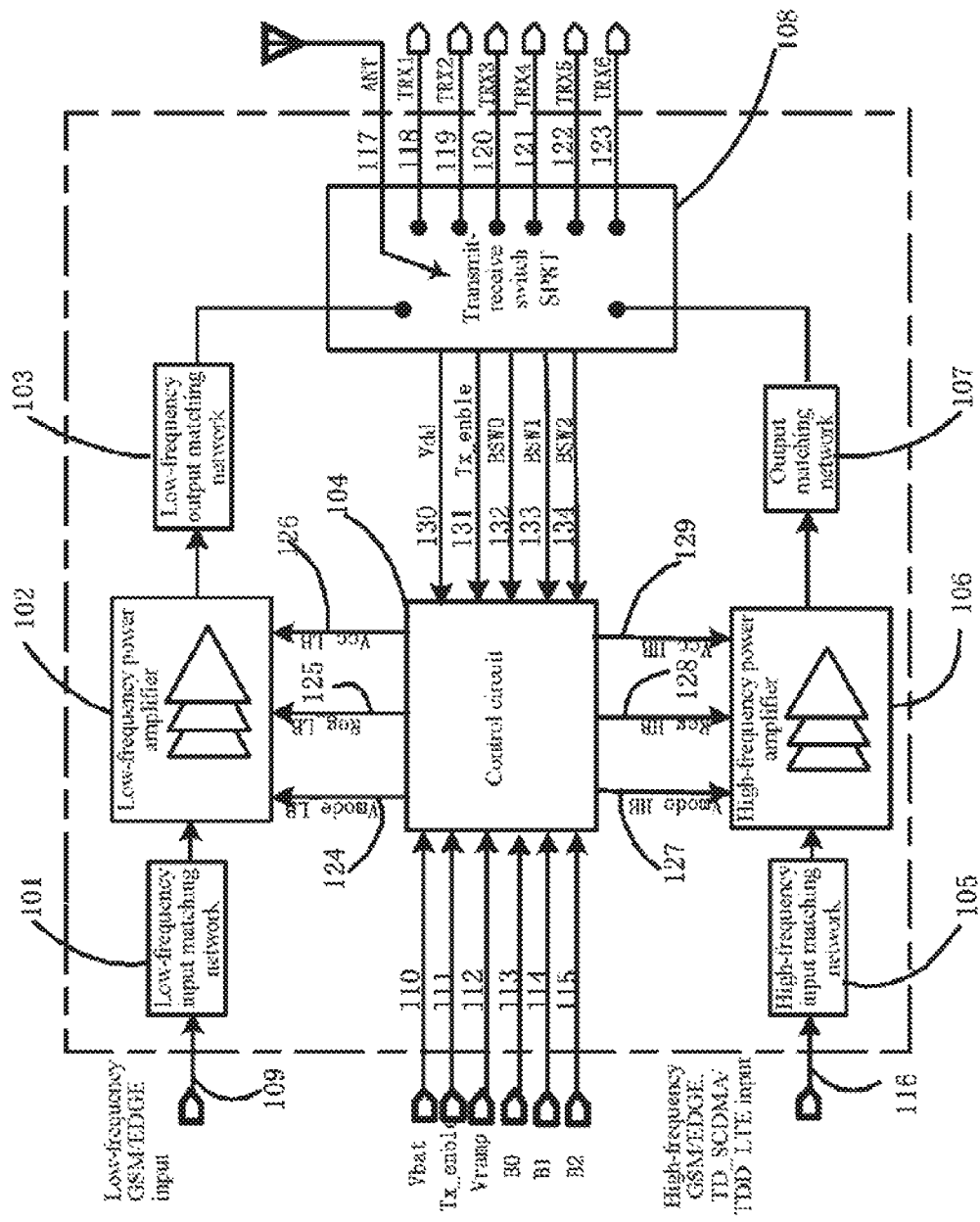
FIG. 2 is a circuit diagram of a multimode power amplifier module according to an embodiment.

FIG. 2 is a circuit diagram of a multimode power amplifier module according to an embodiment. As shown in FIG. 2, the multimode power amplifier module shown in this embodiment is designed to work in GMS (Global System for Mobile Communication), EDGE (Enhanced Data Rate for GSM Evolution), TD_SCDMA (Time Division-Synchronous Code Division Multiple Access), and TDD_LTE (Time Division Long Term Evolution) modes. Based on the foregoing analysis, the GSM mode and the EDGE mode further include a high-frequency mode and a low-frequency mode. Therefore, the two modes are divided into a low-frequency GSM mode, a high-frequency GSM mode, a low-frequency EDGE mode, and a high-frequency EDGE mode.

As shown in FIG. 2, in this embodiment, an external pin of the multimode power amplifier module includes: 109 is a low-frequency input end of a low-frequency power amplifier channel and is used to access a low-frequency GSM/EDGE radio frequency signal. 110 is a power supply access end of a control power supply of a control circuit 104 and is used to access a control power supply Vbat. 111 is a TX_enble interface and is used to access an enable signal of TX to the control circuit. 113/114/115 are interfaces of logic signals B0/B1/B2 and are used to access the logic signals B0/B1/B2 to the control circuit. The three logic signals B0/B1/B2 and the enable signal of TX together constitute a working mode selection signal of the control circuit and together control the multimode power amplifier module to select the working modes. 112 is a baseband signal interface of the control circuit and is used to access a baseband signal Vramp. The baseband signal Vramp may be any value from 0 to 1.8 V. When the GSM mode starts to operate, an output power of the multimode power amplifier module may be adjusted by setting different baseband signals Vramp. 116 is a high-frequency input end of the low-frequency power amplifier channel and is used to access GSM/EDGE/TD_SCDMA/TDD_LTE radio frequency signals. 117 is a transmit-receive switch and is located at an antenna end. 118/119/120/121/122/123 respectively corresponding to TRX1, TRX2, TRX3, TRX4, TRX5, and TRX6, are six transmit-receive ports, and may be used as transmission ports or output ports.

As shown in FIG. 2, in this embodiment, the multimode power amplifier module includes: a low-frequency input matching network 101, used to access a low-frequency GSM/EDGE radio frequency signal, to implement matching of an impedance to 50 Ohm The low-frequency power amplifier 102 is used to amplify the accessed low-frequency GSM/EDGE radio frequency signals (824 MHz to 849 MHz; 880 MHz to 915 MHz). The low-frequency output matching network 103 is used to implement low-frequency impedance conversion, to output a desired output power. The control circuit 104 may be implemented by using a CMOS. This is considered mainly from flexibility of design and costs. The control circuit 104 provides the amplifier control signal to the low-frequency power amplifier 103 and the high-frequency power amplifier 106 mainly according to the baseband signal Vramp and the working mode selection signal. The amplifier control signal includes: a logic signal Vmode, an offset signal Reg, and/or a collector voltage Vcc. In addition, the control circuit 104 also provides a power voltage and a logic voltage to the transmit-receive switch 108. The high-frequency input matching network 105 is used to access a high-frequency GSM/EDGE signal, a TD_SCDMA signal, and a TDD_LTE signal, to implement matching to 500 hm. The high-frequency power amplifier 106 amplifies the accessed high-frequency GSM/EDGE radio frequency signal, TD_SCDMA signal, and TDD_LTE signal (1710 MHz to 2025 MHz). The high-frequency output network 107 is used to implement high-frequency impedance conversion, to output a desired output power. The transmit-receive switch 108 is located at an antenna end and is connected to a transmit output and a receive input. The transmit-receive switch 108 in the embodiment shown in FIG. 2 is SP8T. the transmit-receive switch may be expanded to any SPXT according to needs, and is generally applied in a mobile phone antenna end. X is not less than 4. For example, three-mode five-frequency needs SP8T, five-mode 12-frequency needs SP16T, and SP10T, SP12T, or SP14T is applied in some cases.

The control circuit in the multimode power amplifier module provides an amplifier control signal to the power amplifier according to the baseband signal Vramp and the working mode selection signal, to perform amplification adjustment by controlling the power amplifier. The multimode power amplifier module fully multiplexes the power amplifier channel in this manner, so that different working modes of high and low frequency bands can share the power amplifier channel through adjustment of the control circuit. The amplifier control signal herein includes: the logic signal Vmode, the offset signal Reg, and/or the collector voltage Vcc.

How the control circuit performs amplification adjustment on the power amplifier by using the amplifier control signal is described in detail below by using several embodiments.

Figure 3:
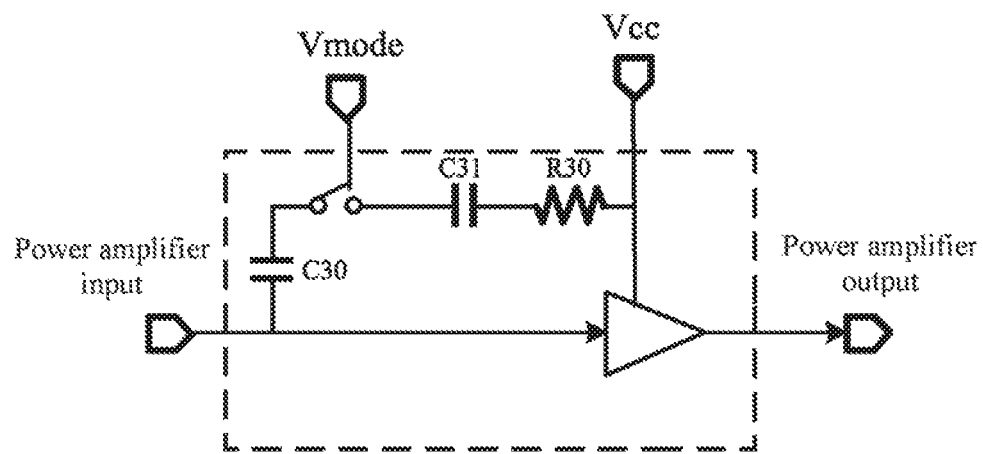
FIG. 3 is a schematic diagram of controlling a power amplifier gain circuit according to a logic signal according to an embodiment.

FIG. 3 is a schematic diagram of controlling a power amplifier gain circuit according to a logic signal. The power amplifier shown in FIG. 3 may be a low-frequency power amplifier or may be a high-frequency power amplifier. As shown in FIG. 3, a collector of the power amplifier is powered by the collector voltage Vcc output by the control circuit. A feedback circuit is disposed in the power amplifier. In FIG. 3, the feedback circuit of the power amplifier is composed of capacitors C30 and C31 and R31 that are mutually connected in series. The logic signal Vmode (for example, 0 or Vbat) output by the control circuit is used to control a feedback switch on the feedback circuit to be opened or closed.

When the logic signal Vmode controls the feedback switch to be opened, the feedback circuit is in a disconnected working state. In this case, because the feedback circuit does not function, the power amplifier is in a high gain mode. Generally, in a GSM working mode, a system requires the highest output power of the power amplifier module. Therefore, when the control circuit is in the working mode, the logic signal Vmode may be output to control the power amplifier to work in the high gain mode.

When the logic signal Vmode controls the feedback switch to be closed, the feedback circuit is in a connected working state. In this case, because the feedback circuit functions, the power amplifier is in a low gain mode. Generally, in EDGE/TD_SCDMA/TDD_LTE modes, a system requires a relatively low output power of the power amplifier module. Therefore, when the control circuit is in the working mode, the logic signal Vmode may be output to control the power amplifier to work in the low gain mode.

It can be learned that in this embodiment, the control circuit may determine, according to the working mode selection signal, a working mode in which the control circuit is, to determine whether the power amplifier should be located in the high gain mode or the low gain mode, to output a corresponding logic signal Vmode to the power amplifier.

As stated above, the collector voltage Vcc output by the control circuit is used to power the corresponding power amplifier as a collector voltage, to adjust an output power of the power amplifier. Therefore, the control circuit outputs different collector voltages Vcc according to current different working modes and may have a function of adjusting output of the power amplifier.

Figure 4:
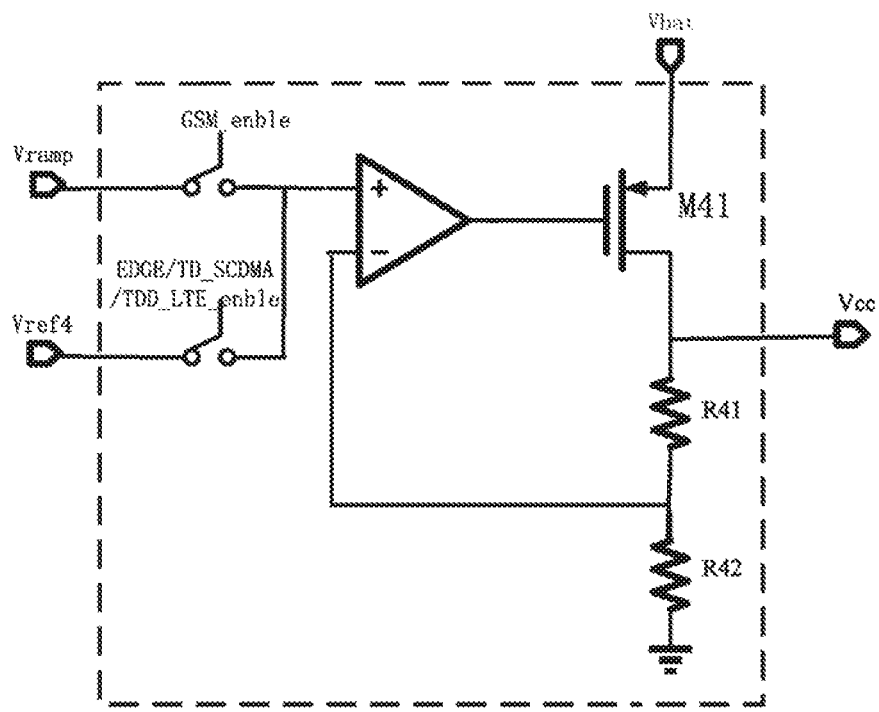
FIG. 4 is a schematic diagram of a collector voltage generation circuit according to an embodiment.

FIG. 4 is a schematic diagram of a collector voltage generation circuit. The collector voltage generation circuit is located in the control circuit. The control circuit determines, according to the working mode selection signal, a working mode in which the control circuit is. A corresponding basis voltage is selected according to the working mode in which the control circuit is, to generate the collector voltage Vcc based on the basis voltage.

As shown in FIG. 4, an operational amplifier is disposed in the collector voltage generation circuit. An output end of the operational amplifier is connected to a gate of an insulated gate biopolar transistor. An emitter of the insulated gate biopolar transistor accesses the control power supply Vbat. A collector of the insulated gate biopolar transistor is an output end of the collector voltage Vcc and is used to output the collector voltage Vcc. A voltage R41 is provided between a negative input end of the operational amplifier and the output end of the collector voltage Vcc. A voltage R42 is provided between the negative input end of the operational amplifier and the ground. A positive input end of the operational amplifier is a basis voltage input end and is used to input a basis voltage selected by the control circuit. As shown in FIG. 4, the basis voltage input end selects, by using different switches, to access different basis voltages.

When the working mode selection signal is in the GSM mode, a GSM_enble switch in FIG. 4 is closed, and the control circuit selects the baseband signal Vramp as the basis voltage, to generate the collector voltage Vcc.

$$Vcc = \left(1 + \frac{R41}{R42}\right) \times Vramp.$$

Different Vcc values are obtained from different baseband Vramp values. Vcc is a power supply voltage of the power amplifier collector, and the output power P and Vcc have the following correspondence:

$$P \cong \frac{Vcc^2}{2R_L},$$

where RL is a load of the power amplifier and is determined by the output matching network. Therefore, the control circuit may adjust the output power of the power amplifier by using different baseband signals Vramp.

When the working mode selection signal is in the EDGE, TD_SCDMA, or TDD_LTE mode, EDGE/TD_SCDMA/TDD_LTE_enble switches in FIG. 4 are closed, and the control circuit selects the reference voltage Vref as the basis voltage, to generate the collector voltage Vcc. In this case, the power amplifier module is in a linear working mode, and change of the output power is implemented by changing change of the input signal.

$$Vcc = \left(1 + \frac{R41}{R42}\right) \times Vref.$$

A proper reference voltage Vref is selected, so that the collector voltage Vcc=Vbat−$V_{DS}$, where $V_{DS}$ is a saturated voltage difference of an M41 source/drain, and is generally 0.15 V to 0.2 V.

Figure 5:
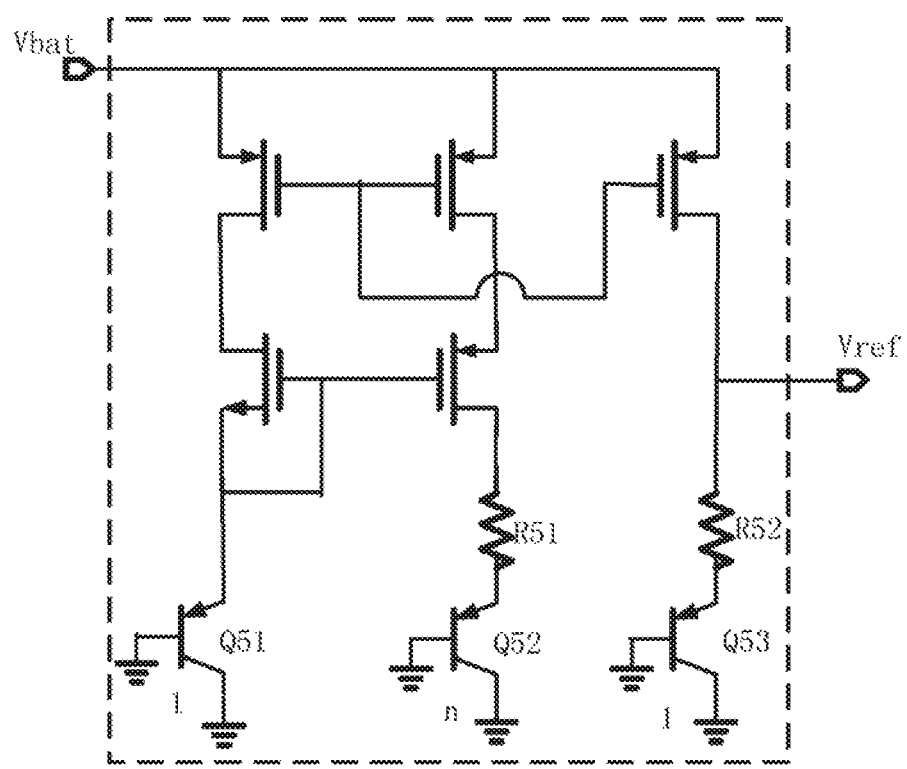
FIG. 5 is a schematic diagram of a reference voltage generation circuit according to an embodiment.

Vref4 is generated by a circuit principle diagram in FIG. 5. In FIG. 5, $$Vref = V_{BEQ53} + \frac{R52}{R51} \times V_T \times \ln n.$$

$V_{BEQ53}$ is a voltage difference from a base to an emitter of a biopolar transistor Q53, and is generally 0.7 V in a silicon process, n is a ratio of Q52 and Q51 emitter areas, and $V_T$ is a thermal voltage and is 0.026 V.

The offset signal Reg is used to adjust a current of the power amplifier. The control circuit controls, according to the working mode selection signal, to close a corresponding switch in the offset signal switch group, to generate an offset signal Reg corresponding to the working mode. Switches corresponding to the working modes are disposed in the offset signal switch group. The offset signal may be a voltage signal or may be a current signal.

Figure 6:
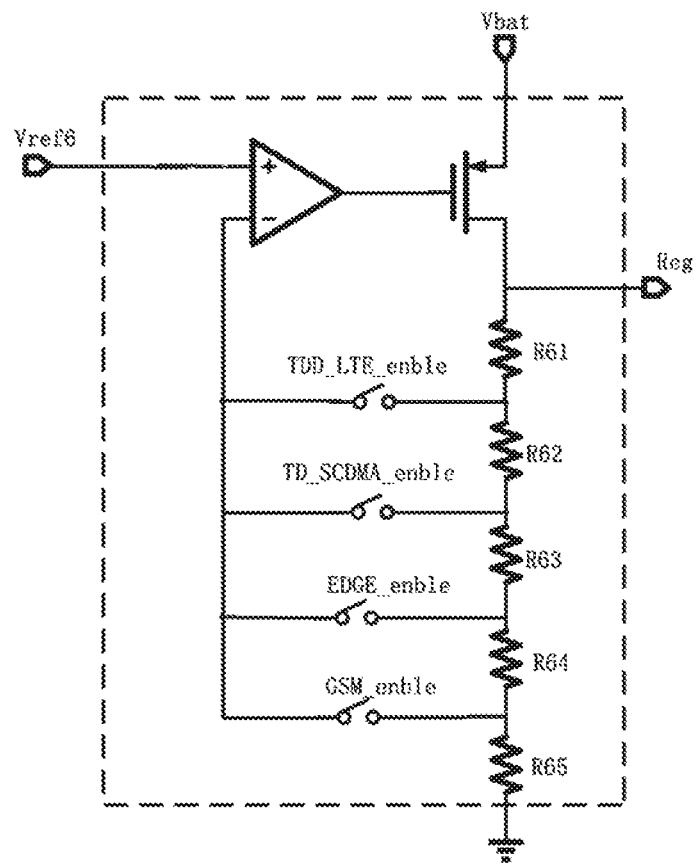
FIG. 6 is a schematic diagram of an offset signal generation circuit according to an embodiment.

FIG. 6 is a schematic diagram of an offset signal generation circuit. The offset signal generation circuit is located in the control circuit. The control circuit determines, according to the working mode selection signal, a working mode in which the control circuit is. The control circuit controls, according to the working mode in which the control circuit is, to close a corresponding switch in the offset signal switch group, to generate an offset signal Reg corresponding to the working mode.

As shown in FIG. 6, the offset signal generation circuit includes: an operational amplifier, a PMOS tube, and the offset signal switch group.

A positive input end of the operational amplifier accesses the reference voltage Vref, and the reference voltage Vref is determined according to the offset signal Reg. Different offset signals Reg are needed in different modes. Reg and Vref conform to certain formulas. An output end of the operational amplifier is connected to a gate of the PMOS tube. A source of the PMOS accesses the control power supply Vbat. A drain of the PMOS is an output end of the offset signal generation circuit and is used to output the offset signal Reg. The reference voltage Vref is generated based on the circuit shown in FIG. 5 and is not described in detail herein.

The offset signal switch group is connected between a negative input end of the operational amplifier and a collector of the PMOS tube. Resistors are connected in series between the switches in the offset signal switch group.

As shown in FIG. 6, a TDD_SCDMA_enble switch, a TDD_LTE_enble switch, an EDGE_enble switch, and a GSM_enble switch are disposed in the offset signal switch group. As shown in FIG. 6, resistors R61, R62, R63, R64, and R65 are respectively connected in series between the switches. The control circuit determines, according to the working mode selection signal, a working mode in which the control circuit is. The control circuit selects, according to the working mode in which the control circuit is, to control closing a corresponding switch in the offset signal switch group. For example, when in the TDD_LTE mode, the control circuit selects to close the TDD_LTE_enble switch, and other switches remain in a disconnected state. The offset signal Reg is generated based on this.

Generally, in the GSM mode, the offset signal Reg is higher, and in the EDGE/TD_SCDMA modes, the offset signals Reg are sequentially reduced. However, the offset voltage in the TDD_LTE mode is between that in the GSM mode and those in the EDGE/TD_SCDMA modes and mainly balances power consumption and linearity. Based on the offset signal generation circuit provided in FIG. 6, in the GSM mode, $$Reg = \left(1 + \frac{R61 + R62 + R63 + R64}{R65}\right) \times Vref;$$

in the EDGE mode, $$Reg = \left(1 + \frac{R61 + R62 + R63}{R64 + R65}\right) \times Vref;$$

in the TDD_SCDMA mode, $$Reg = \left(1 + \frac{R61 + R62}{R63 + R64 + R65}\right) \times Vref;$$

in the TD_LTE mode, $$Reg = \left(1 + \frac{R61}{R62 + R63 + R64 + R65}\right) \times Vref.$$

It can be learned that offset signals Reg corresponding to the GSM, EDGE, TD_SCDMA, and TDD_LTE working modes are sequentially reduced. The general design herein also includes that TD_SDMA and TDD_LTE share the same Reg or the offset signal of TDD_LTE is greater than that of TD_SCDMA.

Certainly, setting of specific switches in the offset signal switch group may be correspondingly adjusted according to specific working mode types supported by the multimode power amplifier module. However, a basic design principle is the same. Any adjustment performed by a person skilled in the art on the offset signal switch group based on the technical teaching provided in this embodiment should be considered to fall within the protection scope of the present invention.

Figure 7:
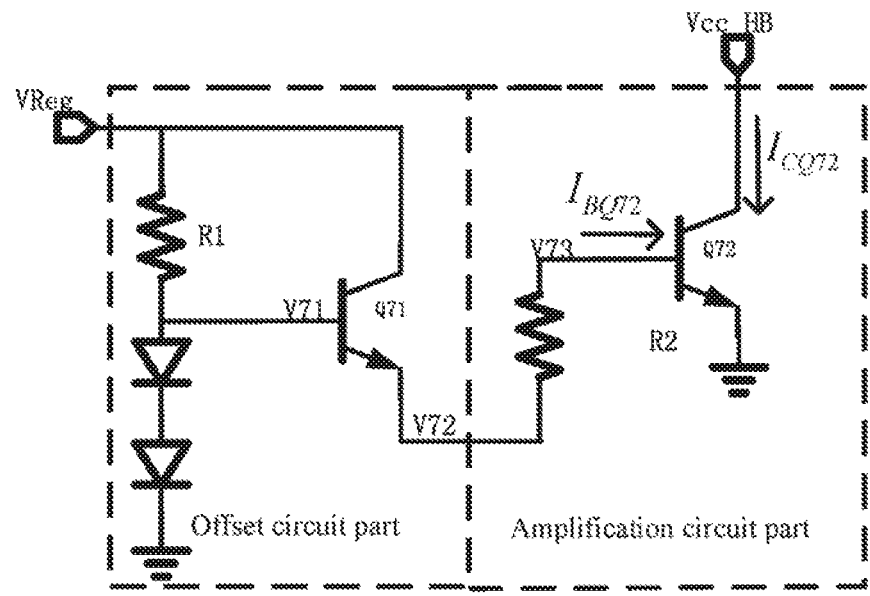
FIG. 7 is a schematic diagram of controlling a one-stage current adjustment circuit in a power amplifier by an offset signal according to an embodiment.

The offset signal adjusts a power amplifier current by using a circuit shown in FIG. 7. FIG. 7 is a principle diagram of controlling a one-stage circuit in a power amplifier by an offset signal. In an actual design, the power amplifier may be two-stage or three-stage, and each stage may be controlled by using an offset circuit part in FIG. 7. In FIG. 7, $$V_{71} \cong \left(\frac{R_{D1} + R_{D2}}{R_{D1} + R_{D2} + R_{71}}\right) \times Reg,$$

where $R_{D1}$ and $R_{D2}$ are conduction resistors of diodes D1 and D2, and after the diodes D1 and D2 are selected, $R_{D1}$ and $R_{D2}$ are fixed values.

$$V_{72} = V_{71} - V_{BEQ71}, \quad V_{73} = V_{BEQ72}, \quad I_{BQ72} = \frac{V72 - V73}{R72},$$

$$I_{CQ72} = \beta \times I_{bQ72} \cong \beta \times \frac{\frac{R_{D1} + R_{D2}}{R_{D1} + R_{D2} + R71} \times Reg - V_{BEQ71} - V_{BEQ72}}{R71},$$

where $V_{BEQ71}$ and $V_{BEQ72}$ are voltage differences between bases and emitters of heterojunction biopolar transistors (HBT) Q71 and Q72. Using a gallium arsenide HBT as an example, $V_{be}=1.3$ V. $I_{BQ72}$ is a base current of the heterojunction biopolar transistor Q72, β is an amplification multiple, generally ranges from 60 to 160, and is mainly determined by a process of the heterojunction biopolar transistor.

As stated above, the offset signal Reg accesses the offset circuit of the power amplifier. The offset circuit includes R71, D71, D72, and a collector of a biopolar transistor Q71. The diodes D71 and D72 and R71 generate V71 through voltage division. V71 generates V72 through voltage drop of one $V_{BE}$. A voltage difference between V72 and V73 determines a current passing through Q72, that is, a base current of the biopolar transistor Q72, to implement current control over Q72. Q72 herein is the power amplifier tube of the power amplifier. The collector of Q71 may also be directly connected to Vbat.

On the other hand, in two time-division multiplexing modes, TD_SCDMA and TDD_LTE, the power amplifier should be in a linear power amplification state all the time. When an output power of the multimode power amplifier module is relatively high, to ensure certain linearity, the power amplifier needs a relatively large offset current. In this case, the control circuit needs to provide a relatively large offset signal Reg. In this way, performance of the multimode power amplifier module is optimized. When the output power of the multimode power amplifier module is relatively low, in this case, the power amplifier needs only a relatively low offset current to implement enough linearity. In this case, if the control circuit provides a relatively small offset signal Reg, the offset current needed by the power amplifier can be reduced, to reduce power consumption of the multimode power amplifier module.

As stated above, the control circuit in the multimode power amplifier module provides the amplifier control signal to the power amplifier according to the baseband signal and the working mode selection signal, to perform amplification adjustment by controlling the power amplifier. The amplifier control signal herein includes but is not limited to: the logic signal Vmode, the offset signal Reg, and/or the collector voltage Vcc. In the existing two time-division multiplexing modes, TD_SCDMA and TDD_LTE, the baseband signal Vramp participate in selection of the two time-division multiplexing modes as a logic level, and may be a high level or a low level. Therefore, the offset voltage or offset current in the two time-division multiplexing modes has only one value and cannot be adjusted according to the output power of the multimode power amplifier module.

Other embodiments provided in the present invention breaks through the foregoing technical limitation, and creatively propose making the offset voltage or offset current implement a plurality of values in the time-division multiplexing mode as the baseband signal Vramp varies. For unity of descriptions, the foregoing offset voltage and offset current are collectively referred to as offset signals Reg. that is, in a scenario in which a voltage signal needs to be used as an offset signal, the offset signal Reg is the offset voltage; in a scenario in which a current signal needs to be used as an offset signal, the offset signal Reg is the offset current. Change of the offset voltage or offset current causes an output current of the power amplifier to change, to optimize performance and power consumption of the entire multimode power amplifier module.

How the control circuit adjusts the offset signal Reg of the power amplifier by using the baseband signal Vramp is specifically described below by using several other embodiments.

Figure 8:
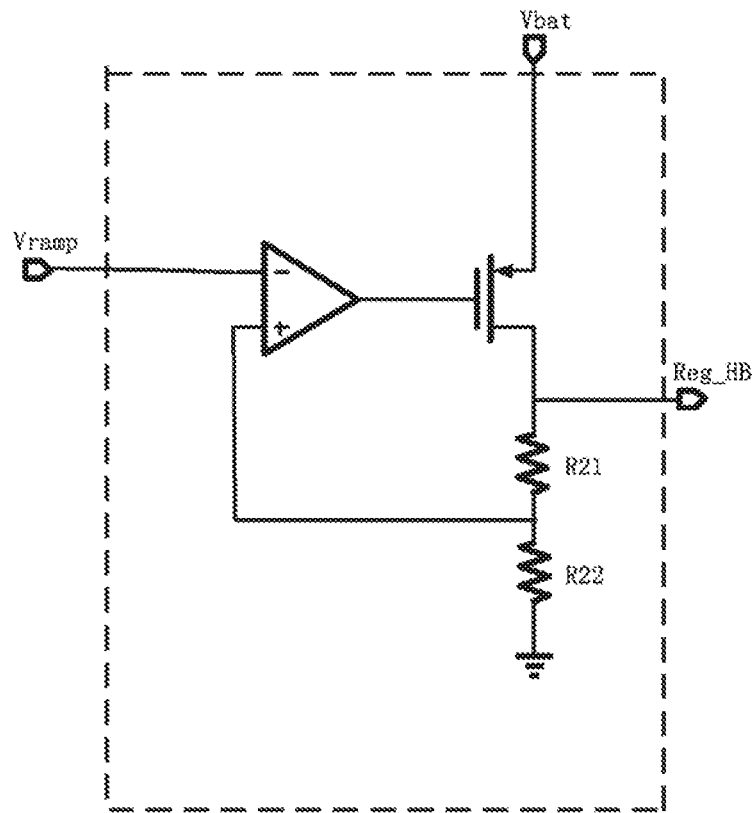
FIG. 8 is a schematic diagram of a first embodiment of controlling a power amplifier offset signal according to a baseband signal.

FIG. 8 is a schematic diagram of a first embodiment of controlling a power amplifier offset signal according to a baseband signal. In this embodiment, the baseband signal Vramp is input into the negative input end (also referred to as a reverse-phase input end) of the operational amplifier. The output end of the operational amplifier is connected to a gate of an insulated gate biopolar transistor. A source of the insulated gate biopolar transistor accesses the control power supply Vbat. A drain of the insulated gate biopolar transistor is an output end of the offset signal Reg and is used to output an offset signal. The drain of the insulated gate biopolar transistor is grounded by using resistors R21 and R22. A connection point of the resistors R21 and R22 is directly connected to a positive input end (also referred to as an in-phase input end) of the operational amplifier.

Figure 9:
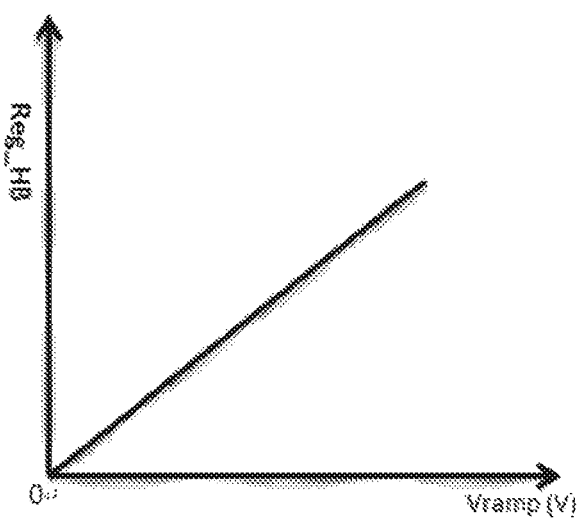
FIG. 9 is a schematic diagram of a relationship between an offset signal Reg and a baseband signal Vramp according to the first embodiment.

As shown in FIG. 9, in the two time-division multiplexing modes, TD_SCDMA and TDD_LTE, by using the baseband signal Vramp, the offset signal Reg and the baseband signal Vramp are made to satisfy a linear function relationship. For example, Reg=G*Vramp or Reg=G*(Vramp+Voffset), where a parameter G is a fixed value. The offset signal Reg herein may be a voltage signal or may be a current signal. According to a value of the baseband signal Vramp and a value of the offset voltage or offset current that is needed for design of optimization, the corresponding parameter G can be obtained. In the first embodiment shown in FIG. 8, the following formula:

$$\text{Reg\_HB} = \left(1 + \frac{R21}{R22}\right) \times Vramp$$

can be obtained. In other words, the parameter G needed by a user can be obtained by selecting proper resistances of the resistors R21 and R22.

Figure 10:
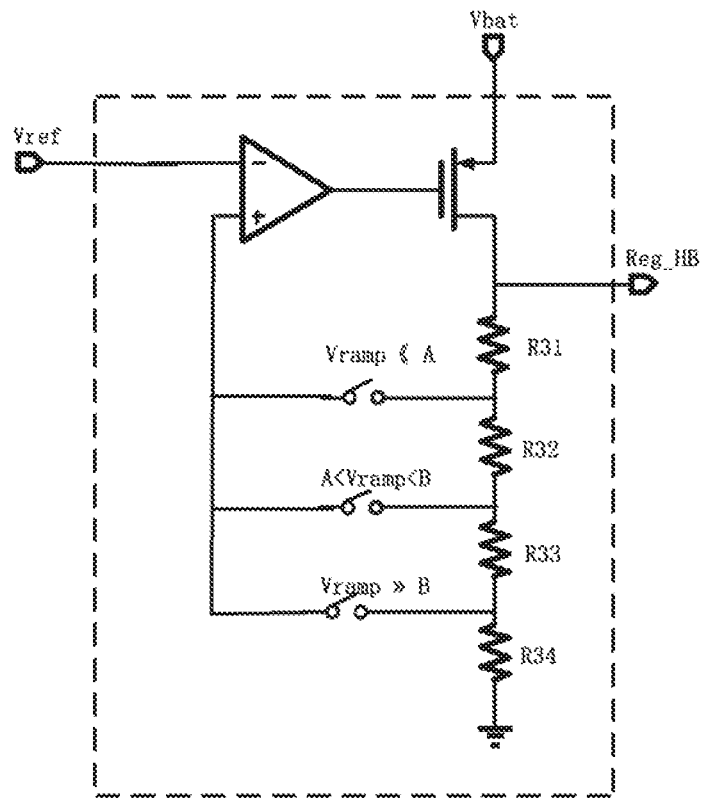
FIG. 10 is a schematic diagram of a second embodiment of controlling a power amplifier offset signal according to a baseband signal.

FIG. 10 is a schematic diagram of a second embodiment of controlling a power amplifier offset signal according to a baseband signal. In the second embodiment, connection manners of most of circuits are basically the same as those in the first embodiment, and a difference mainly lies in a drain output part of the insulated gate biopolar transistor. In the second embodiment, the collector of the insulated gate biopolar transistor is connected to the ground by using the resistors R31, R32, R33, and R34. A gating switch is disposed between a connection point of the resistors R31 and R32 and the positive input end of the operational amplifier. The gating switch is conducted when Vramp<A and is closed in other cases. A gating switch is disposed between a connection point of the resistors R32 and R33 and the positive input end of the operational amplifier. The gating switch is conducted when A<Vramp<B and is closed in other cases. A gating switch is disposed between a connection point of the resistors R33 and R34 and the positive input end of the operational amplifier. The gating switch is conducted when Vramp>B and is closed in other cases. Herein, A and B are particular threshold voltages.

Figure 11:
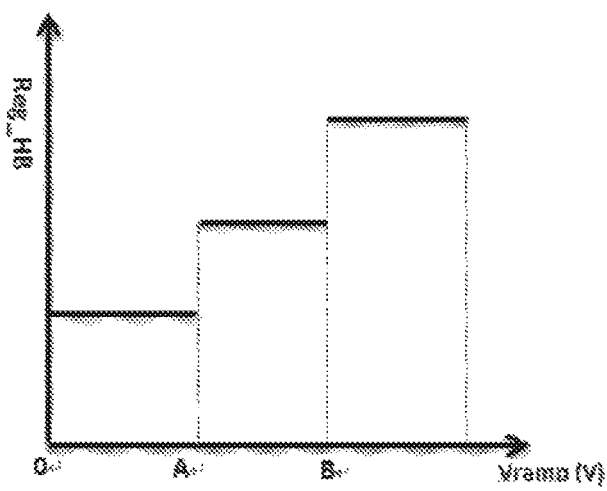
FIG. 11 is a schematic diagram of a relationship between an offset signal Reg and a baseband signal Vramp according to the second embodiment.

Based on the circuit diagram of the second embodiment shown in FIG. 10, the offset signal Reg and the baseband signal Vramp may be made to in the stair step linear relationship shown in FIG. 11. In the embodiment shown in FIG. 11, using an example in which a stair step shape is divided into three segments, the offset signal Reg may be set to several fixed values according to different baseband signal Vramp values. That is, when Vramp<A, Reg=V1; when A<Vramp<B, Reg=V2. When Vramp>B, Reg=V3. Further, when Vramp<A, $$\text{Reg\_HB} = V1 = \left(1 + \frac{R31}{R32 + R33 + R34}\right) \times Vramp;$$

when A<Vramp<B, $$Reg_{HB} = V2 = \left(1 + \frac{R31 + R32}{R33 + R34}\right) \times Vramp;$$

when Vramp>B, $$Reg\_HB = V3 = \left(1 + \frac{R31 + R32 + R33}{R34}\right) \times Vramp.$$

Herein, V1<V2<V3. In an actual implementation process, a value of a relationship between V1, V2, and V3 is determined by the designed performance requirement, and the value may be 0.

Figure 12:
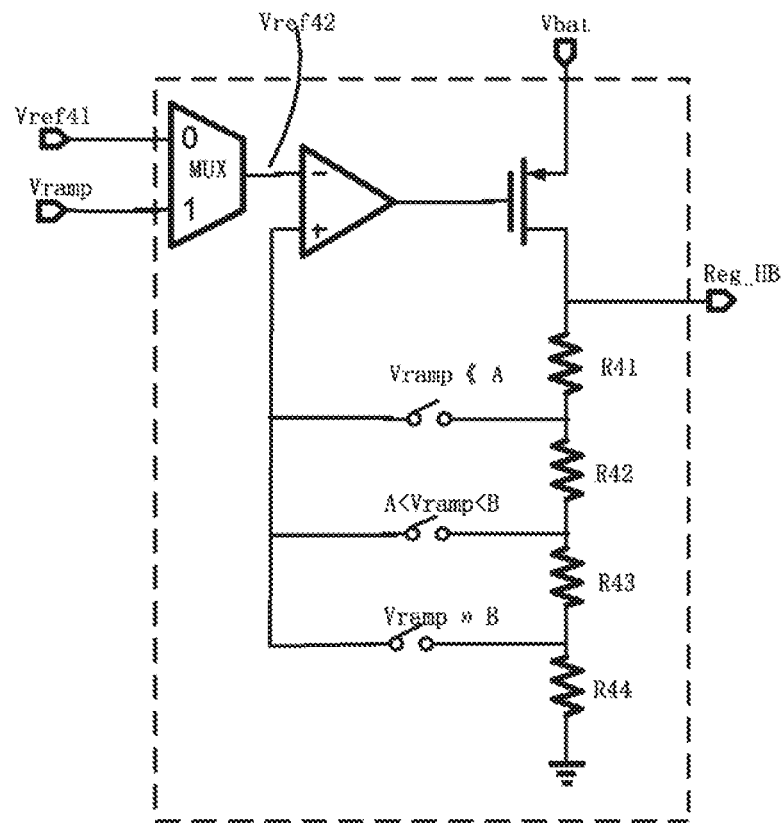
FIG. 12 is a schematic diagram of a third embodiment of controlling a power amplifier offset signal according to a baseband signal.

FIG. 12 is a schematic diagram of a third embodiment of controlling a power amplifier offset signal according to a baseband signal. In the third embodiment, connection manners of most of circuits are basically the same as those in the second embodiment, and a difference mainly lies in that the baseband signal Vramp and the reference voltage Vref41 respectively access a positive input end and a negative input end of a multi-channel analog switch (MUX). An output end signal Vref42 of the multi-channel analog switch, in replacement of an original baseband signal Vramp, accesses the negative input end of the operational amplifier. The multi-channel analog switch has at least two channels, and opening or closing of the channels are determined by the baseband signal and the working mode. In the third embodiment, the collector of the insulated gate biopolar transistor is connected to the ground by using the resistors R41, R42, R43, and R44. A gating switch is disposed between a connection point of the resistors R41 and R42 and the positive input end of the operational amplifier. The gating switch is conducted when Vramp<A and is closed in other cases. A gating switch is disposed between a connection point of the resistors R42 and R43 and the positive input end of the operational amplifier. The gating switch is conducted when A<Vramp<B and is closed in other cases. A gating switch is disposed between a connection point of the resistors R43 and R44 and the positive input end of the operational amplifier. The gating switch is conducted when Vramp>B and is closed in other cases. Herein, A and B are particular threshold voltages.

Figure 13:
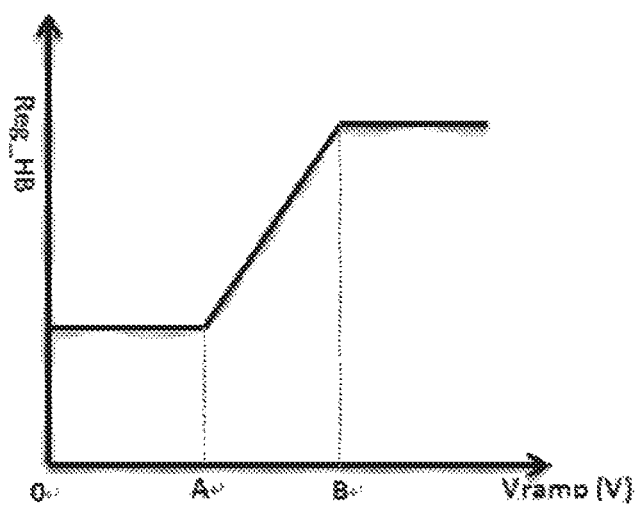
FIG. 13 is a schematic diagram of a relationship between an offset signal Reg and a baseband signal Vramp according to the third embodiment.

Based on the circuit diagram of the third embodiment shown in FIG. 12, the offset signal Reg and the baseband signal Vramp may be made to in the step linear relationship shown in FIG. 13. In the embodiment shown in FIG. 13, using an example in which a step shape is divided into three segments, the offset signal Reg may be set to several fixed values according to different baseband signal Vramp values. That is, when the baseband signal Vramp<A, the offset signal Reg is a fixed voltage value V4; when A<Vramp<B, the offset signal Reg=V5=G*Vramp; when the baseband signal Vramp>B, the offset signal Reg is also a fixed voltage value, and Reg=V6. Further, when the baseband signal Vramp<A, the multi-channel analog switch changes an output thereof to Vref4=Vref, and $$Reg_{HB} = V4 = \left(1 + \frac{R41}{R42 + R43 + R44}\right) \times Vref.$$

When A<Vramp<B, the multi-channel analog switch changes the output thereof to Vref4=Vramp, and $$Reg\_HB = V2 = \left(1 + \frac{R31 + R32}{R33 + R34}\right) \times Vramp.$$

When the baseband signal Vramp>B, the multi-channel analog switch changes the output thereof to Vref42=Vref41, and $$Reg\_HB = V2 = \left(1 + \frac{R31 + R32 + R33}{R34}\right) \times Vref41.$$

It should be noted that if more resistors are disposed between the drain of the transistor and the ground, and more gating switches are disposed, the stair step linear relationship between the baseband signal Vramp and the offset signal Reg can be made to become more complex and various, to satisfy actual needs of different application scenarios. The transistor herein includes but is not limited to the insulated gate biopolar transistor, the field-effect transistor, or a triode. Corresponding circuit adjustment is a conventional technical means that can be mastered by a person skilled in the art and does not go beyond the technical teaching provided in the present invention, and is not described in detail herein.

On the other hand, although TD_SCDMA and TDD_LTE are both time-division multiplexing working modes, they have different requirements on the offset signal Reg. therefore, in the TD_SCDMA and TDD_LTE modes, working performance can be further optimized by setting different baseband signals Vramp.

Based on different embodiments of the foregoing multimode power amplifier module, a multimode power amplifier module output control method provided in the present invention may be further summarized. The method includes the following steps: providing an offset signal to a low-frequency power amplifier channel, where a magnitude of the offset signal is determined by a magnitude of a baseband signal and a working mode; and providing an offset signal to a high-frequency power amplifier channel, where a magnitude of the offset signal is determined by the magnitude of the baseband signal and the working mode. The offset signal is controlled by the baseband signal and the working mode and linearly or very nearly linearly changes with the baseband signal. Alternatively, the offset signal is controlled by the baseband signal and the working mode and changes with the baseband signal in a stair step manner. Alternatively, the offset signal is controlled by the baseband signal and the working mode and linearly changes with the baseband signal in a step manner.

The multimode power amplifier module shown in the foregoing embodiment may be used in a chip. The structure of the multimode power amplifier module in the chip is not described in detail herein.

In addition, the multimode power amplifier module may also be used in a communication terminal as an important component of a radio frequency circuit. The communication terminal herein refers to a computer device that may be used in a mobile environment and supports a plurality of communication modes such as GSM, EDGE, TD_SCDMA, TDD_LTE, and FDD_LTE. The communication terminal includes but is not limited to a mobile phone, a notebook computer, a tablet computer, and an on-board computer. In addition, the multimode power amplifier module is also applicable to scenarios to which other multi-mode technologies are applied, for example, a communication base station compatible with multiple communication systems. Details are not provided herein.

The multimode power amplifier module, the chip, and the communication terminal provided in the present invention are described in detail above. For a person of ordinary skill in the art, any obvious change made under the premise of not departing from the substantial spirit of the present invention shall construct violation to the patent right of the present invention and bear a corresponding legal responsibility.

What is claimed is:

1. A multimode power amplifier module, comprising a low-frequency power amplifier channel, a high-frequency power amplifier channel, a control circuit, and a transmit-receive switch, wherein
    the low-frequency power amplifier channel comprises a low-frequency input matching network, a low-frequency power amplifier, and a low-frequency output matching network that are connected in series and in sequence; the low-frequency input matching network is used to access a low-frequency radio frequency signal, to implement impedance matching; the low-frequency power amplifier is used to amplify the low-frequency radio frequency signal; the low-frequency output matching network is used to implement low-frequency impedance conversion, to output a low-frequency output power according to the amplified low-frequency radio frequency signal;
    the high-frequency power amplifier channel comprises a high-frequency input matching network, a high-frequency power amplifier, and a high-frequency output matching network that are connected in series and in sequence; the high-frequency input matching network is used to access a high-frequency radio frequency signal, to implement impedance matching; the high-frequency power amplifier is used to amplify the high-frequency radio frequency signal; the high-frequency output matching network is used to implement high-frequency impedance conversion, to output a high-frequency output power according to the amplified high-frequency radio frequency signal;
    the control circuit accesses a power supply Vbat, a baseband signal Vramp, and a working mode selection signal; the control circuit sends an amplifier control signal to the low-frequency power amplifier or the high-frequency power amplifier, to control the low-frequency power amplifier or the high-frequency power amplifier to amplify the accessed low-frequency radio frequency signal or high-frequency radio frequency signal;
    the control circuit comprises an offset signal generation circuit; the offset signal generation circuit comprises: an operational amplifier, a p-channel metal-oxide-semiconductor (PMOS) field-effect transistor, and an offset signal switch group;
    a positive input end of the operational amplifier accesses a reference voltage Vref; the reference voltage Vref is determined according to an offset signal Reg; an output end of the operational amplifier is connected to a gate of the PMOS field-effect transistor; a source of the PMOS field-effect transistor accesses the power supply Vbat; and a drain of the PMOS field-effect transistor is an output end of the offset signal generation circuit and is used to output the offset signal Reg; and the offset signal switch group is connected between a negative input end of the operational amplifier and the drain of the PMOS field-effect transistor; and resistors are connected in series between switches in the offset signal switch group; and
    the transmit-receive switch is connected to the control circuit, the low-frequency output matching network, and the high-frequency output matching network; and the transmit-receive switch is used to select, according to the working mode selection signal, a corresponding working mode for transmission or receiving.

2. The multimode power amplifier module according to claim 1, wherein
    the multimode power amplifier module supports a GSM, EDGE, TD_SCDMA, and/or a TDD_LTE working mode;
    the low-frequency input matching network is used to access a low-frequency GSM signal or a low-frequency EDGE signal; and
    the high-frequency input matching network is used to access a high-frequency GSM signal, a high-frequency EDGE signal, a TD_SCDMA signal, or a TDD_LTE signal.

3. The multimode power amplifier module according to claim 2, wherein the offset signals Reg corresponding to the GSM, EDGE, TDD_LTE, and TD_SCDMA working modes are sequentially reduced.

4. The multimode power amplifier module according to claim 1, wherein
    the amplifier control signal sent by the control circuit to the low-frequency power amplifier or the high-frequency power amplifier includes: a logic signal Vmode, the offset signal Reg, and/or a collector voltage Vcc.

5. The multimode power amplifier module according to claim 4, wherein
    a feedback circuit is disposed in the low-frequency power amplifier or the high-frequency power amplifier; the logic signal Vmode is used to control a feedback switch on the feedback circuit to be opened or closed;
    when the logic signal Vmode controls the feedback switch to be opened, the low-frequency power amplifier or the high-frequency power amplifier works in a high gain mode; and
    when the logic signal Vmode controls the feedback switch to be closed, the low-frequency power amplifier or the high-frequency power amplifier works in a low gain mode.

6. The multimode power amplifier module according to claim 4, wherein
    the collector voltage Vcc is used to supply power to the low-frequency power amplifier or the high-frequency power amplifier, to control an output power of the low-frequency radio frequency signal or the high-frequency radio frequency signal amplified by the low-frequency power amplifier or the high-frequency power amplifier; and
    the control circuit selects a corresponding basis voltage according to the working mode selection signal and generates the collector voltage Vcc according to the basis voltage.

7. The multimode power amplifier module according to claim 6, wherein
    when the working mode selection signal is in a GSM mode, the control circuit selects the baseband signal Vramp as the basis voltage, to generate the collector voltage Vcc; and when the working mode selection signal is in an EDGE, TD_SCDMA, or TDD_LTE mode, the control circuit selects the reference voltage Vref as the basis voltage, to generate the collector voltage Vcc, wherein the reference voltage Vref is determined according to the offset signal Reg.

8. The multimode power amplifier module according to claim 4, wherein
the offset signals LB_Reg and HB_Reg are used to adjust a current of the low-frequency power amplifier or the high-frequency power amplifier; and
the control circuit closes a corresponding switch in the offset signal switch group according to the working mode selection signal, to generate an offset signal Reg corresponding to a working mode; and switches corresponding to the working modes are disposed in the offset signal switch group.

9. A method for controlling the multimode power amplifier module according to claim 1, comprising the following steps:
providing an offset signal to a low-frequency power amplifier channel, wherein a magnitude of the offset signal is determined by a magnitude of a baseband signal and a working mode; and
providing an offset signal to a high-frequency power amplifier channel, wherein a magnitude of the offset signal is determined by the magnitude of the baseband signal and the working mode.

10. The control method according to claim 9, wherein the offset signal is controlled by the baseband signal and the working mode and linearly or nearly linearly changes with the baseband signal.

11. The control method according to claim 9, wherein the offset signal is controlled by the baseband signal and the working mode and changes with the baseband signal in a stair step manner.

12. The control method according to claim 9, wherein the offset signal is controlled by the baseband signal and the working mode and linearly changes with the baseband signal in a step manner.

13. A time-division-multiplexing-oriented multimode power amplifier module, comprising a low-frequency power amplifier channel, a high-frequency power amplifier channel, a control circuit, and a transmit-receive switch, wherein
the low-frequency power amplifier channel comprises a low-frequency input matching network, a low-frequency power amplifier, and a low-frequency output matching network that are connected in series and in sequence; the low-frequency input matching network is used to access a low-frequency radio frequency signal, to implement impedance matching; the low-frequency power amplifier is used to amplify the low-frequency radio frequency signal; the low-frequency output matching network is used to implement low-frequency impedance conversion, to output a low-frequency output power according to the amplified low-frequency radio frequency signal;
the high-frequency power amplifier channel comprises a high-frequency input matching network, a high-frequency power amplifier, and a high-frequency output matching network that are connected in series and in sequence; the high-frequency input matching network is used to access a high-frequency radio frequency signal, to implement impedance matching; the high-frequency power amplifier is used to amplify the high-frequency radio frequency signal; the high-frequency output matching network is used to implement high-frequency impedance conversion, to output a high-frequency output power according to the amplified high-frequency radio frequency signal; and
the control circuit generates different offset signals in a time-division multiplexing working mode according to magnitudes of baseband signals, to offset the low-frequency power amplifier or the high-frequency power amplifier to amplify the accessed low-frequency radio frequency signal or high-frequency radio frequency signal; and the transmit-receive switch selects, according to a working mode selection signal, a corresponding working mode for transmission or receiving;
in the control circuit, the baseband signal is input to a negative input end of an operational amplifier, and an output end of the operational amplifier is connected to a gate of the transistor; and a source of the transistor accesses a control power supply, and a drain outputs the offset signal.

14. The multimode power amplifier module according to claim 13, wherein in the control circuit, the baseband signal and the reference voltage respectively access a positive input end and a negative input end of a multi-channel analog switch, and an output end of the multi-channel analog switch accesses a negative input end of the operational amplifier.

15. The multimode power amplifier module according to claim 14, wherein the multi-channel analog switch has at least two channels, and opening or closing of the channels are determined by the baseband signal and the working mode.

16. The multimode power amplifier module according to claim 13, wherein in the control circuit, the drain of the transistor is connected to the ground by using a first resistor and a second resistor that are connected in series, and a connection point of the first resistor and the second resistor is connected to a positive input end of the operational amplifier.

17. The multimode power amplifier module according to claim 16, wherein
in the control circuit, a gating switch is disposed between a connection point of adjacent resistors and the positive input end of the operational amplifier, and the gating switch changes an on-off state according to the baseband signal or the working mode.

18. The multimode power amplifier module according to claim 13, wherein in the control circuit, the drain of the transistor is connected to the ground by using a plurality of resistors that are mutually connected in series, and a connection point of adjacent resistors is connected to a positive input end of the operational amplifier.

* * * * *